(12) United States Patent
Fleizach et al.

(10) Patent No.: US 8,370,413 B1
(45) Date of Patent: Feb. 5, 2013

(54) NO-MULTIPLY FINITE IMPULSE RESPONSE (FIR) FILTER USING PHASE ADDITIONS

(75) Inventors: Gregory Fleizach, San Diego, CA (US); Ralph Hunt, San Marcos, CA (US); Michael Anderson, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 571 days.

(21) Appl. No.: 12/715,584

(22) Filed: Mar. 2, 2010

(51) Int. Cl.
*G06F 17/10* (2006.01)
*G06F 17/17* (2006.01)
(52) U.S. Cl. ........ 708/300; 708/200; 708/301; 708/306; 708/308
(58) Field of Classification Search .................. None
See application file for complete search history.

(56) References Cited

U.S. PATENT DOCUMENTS

| | | | |
|---|---|---|---|
| 4,862,402 A | 8/1989 | Shah | |
| 5,353,026 A | 10/1994 | Wilson | |
| 2002/0181574 A1 * | 12/2002 | Aizawa et al. | 375/232 |
| 2007/0083581 A1 | 4/2007 | Kim | |

\* cited by examiner

*Primary Examiner* — Scott Sun
(74) *Attorney, Agent, or Firm* — Kyle Eppele; Stephen E. Baldwin (57) ABSTRACT

The present invention is directed toward a Finite Impulse Response (FIR) no-multiply filter (NMF), which replaces complex multiplications with phase additions. At each tap in the FIR filter, only phases are accumulated and at the output the complex result is reconstructed in I/Q. Noise dither is relied upon to smooth the digitized phase resolution. The NMF is ideally suited to a matched filtering scenario for constant modulus signals.

13 Claims, 8 Drawing Sheets

FIG. 10

NO-MULTIPLY FINITE IMPULSE RESPONSE (FIR) FILTER USING PHASE ADDITIONS

FEDERALLY-SPONSORED RESEARCH AND DEVELOPMENT

This invention (Navy Case No. 100333) is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-2778; email T2@spawar.navy.mil.

BACKGROUND

Figure 1:
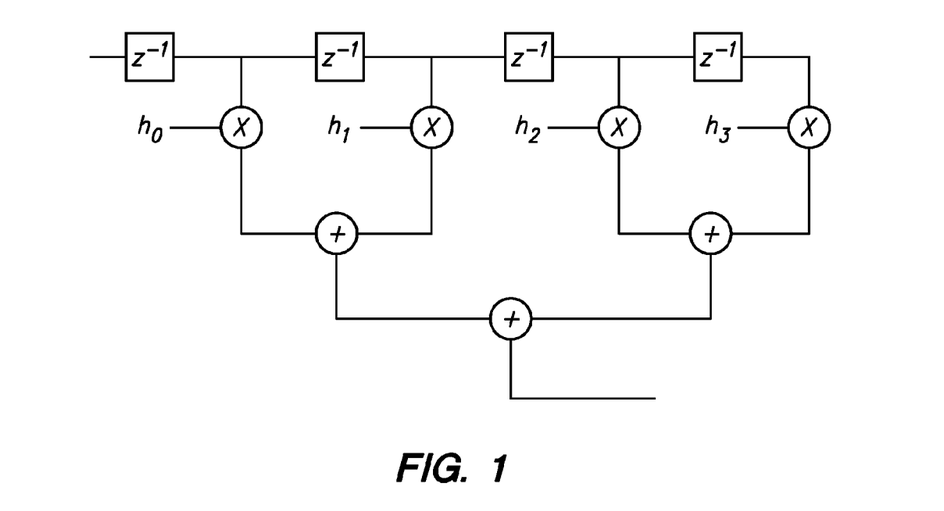
FIG. 1 shows a block diagram of a Direct-Form FIR Filter.

The present invention relates to a finite impulse response (FIR) filter. A standard FIR filter (direct-form) is shown in FIG. 1 and given by the equation $$y_k = \sum_{n=0}^{N-1} h_n r_{k-n}$$

where h represents the filter coefficients, r represents the data to be filtered, and N is the length of the filter. In FIG. 1, the $z^{-1}$ symbol represents a unit delay operator, the X symbol represents a multiplier function, and the + symbol represents an adder function. The equation for a matched FIR filter is $$y_{k+(N-1)} = \sum_{n=0}^{N-1} s_n^* r_{k+n}$$

where the filter is the complex conjugate of the reference signal, s, and has been time reversed. Each data sample in the filter is multiplied by a tap coefficient and these products are summed to create a single output whenever a data sample is shifted in. The problem with implementing this architecture in hardware (i.e., FPGA or ASIC) is that multipliers are resource-intensive. The number of bits that must be stored is also doubled when a multiplication occurs. The number of bits additionally increases by $\log_2(N)$ from the additions in the adder tree (where N is the number of taps in the filter). Thus the number of bits at the output is $2B+\log_2(N)$, where B is the number of bits input to the filter. For a complex multiplication, one realization requires three real FIR filters to perform the four multiplications (using sums and differences). That is, three of the filters in FIG. 1 would be needed in parallel.

Figure 2:
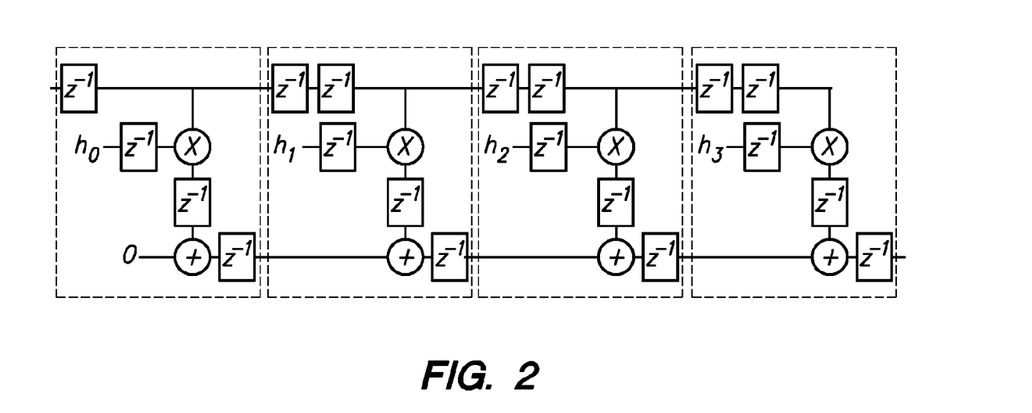
FIG. 2 shows a block diagram of a systolic FIR Filter.

A problem specific to the direct-form FIR implementation is the limitation due to timing caused by the adder tree. This adder tree is needed to sum all the products. A systolic FIR filter implementation, shown in FIG. 2, provides identical results to a direct-form FIR filter, but without the problems associated with the adder tree. Each tap is contained within a dashed-line box. A systolic FIR filter implementation can be characterized as a form of a computing pipeline of data processing cell elements connected in series, where the outputs of any one cell element are the inputs of the next one. The typical systolic FIR filter implementation, however, also contains multiplies, as shown in FIG. 2. Again, constructing multipliers in hardware is resource-intensive and the same bit-growth problems exist here. As with the direct-form filter, three systolic filters would be needed for a complex filter.

SUMMARY

The present invention provides a Finite Impulse Response (FIR) no-multiply filter (NMF) to reduce the size of a FIR filter when implemented in hardware (and thus its weight and its power consumption) by replacing multiplications of complex numbers with additions of phases. In one preferred embodiment, the no-multiply finite impulse response (FIR) filter comprises a phase digitizer for converting input I/Q (In-phase/Quadrature-phase) sequential data samples into digitized phase signals, the digitized phase signals having a fixed number of bit values representative of the number of quantized phases; the no-multiply filter (NMF) taps for receiving the digitized phase signals, the NMF including incrementable or decrementable phase accumulators within the taps for implementing NMF finite impulse response taps where at each tap only the respective phases are accumulated and where a tap coefficient phase corresponds to the digitized phases, and where an accumulator to be incremented or decremented is calculated by subtracting the tap coefficient phase from the digitized phase signal input; and an I/Q reconstruction stage for reconstructing an I/Q output from the values of the phase accumulators in the last tap where the phase values are combined to produce the I/Q output.

BRIEF DESCRIPTION OF THE DRAWINGS

Throughout the several views, like elements are referenced using like references, wherein.

DETAILED DESCRIPTION OF THE EMBODIMENTS

The present invention, called a no-multiply filter (NMF), replaces complex multiplications with phase additions. At each tap in the FIR filter only phases are accumulated and at the output the complex result is reconstructed in I/Q. Noise dither is relied upon to smooth the digitized phase resolution. The NMF is ideally suited to a matched filtering scenario for constant modulus signals. A general block diagram of the architecture 10 can be seen in FIG. 3.

Figure 3:
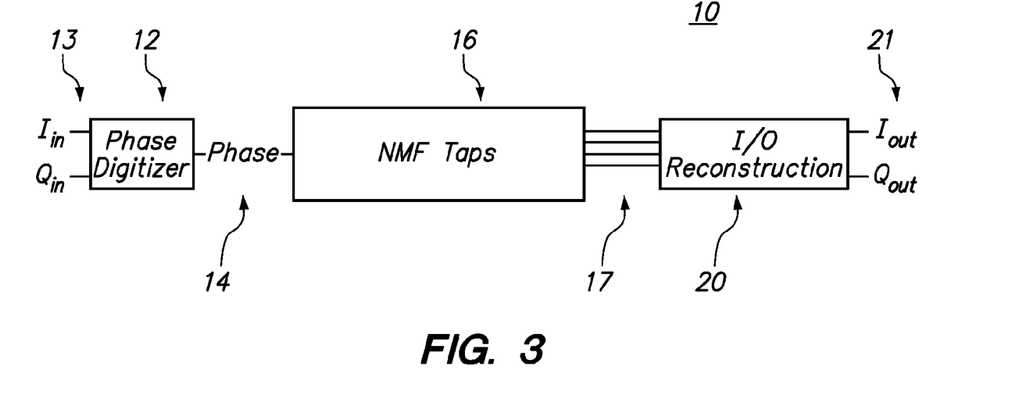
FIG. 3 shows a block diagram of a no-multiply filter (NMF) architecture of the present invention.

In FIG. 3, the NMF 10 involves conversion from complex inputs (I/Q) 13 to phase digitizer 12, which forms quantized and digitized phase values 14 as the input to the NMF taps 16. Any number of digitized phase values may be used, but for simplicity an implementation with 8 phases is described. Implementing a different number of phases is a straightforward extension. There are essentially three stages in the NMF 10: 1) phase digitizer 12, which converts I/Q inputs 13 to digital phase signals 14; 2) NMF taps 16 which receives the phase signals 14 and forms accumulated values 17, and 3) I/Q reconstruction 20, which receives the accumulated values 17 and forms the I/Q output 21. For a detection scenario, the I/Q reconstruction would be followed by an absolute value and threshold.

Figure 4:
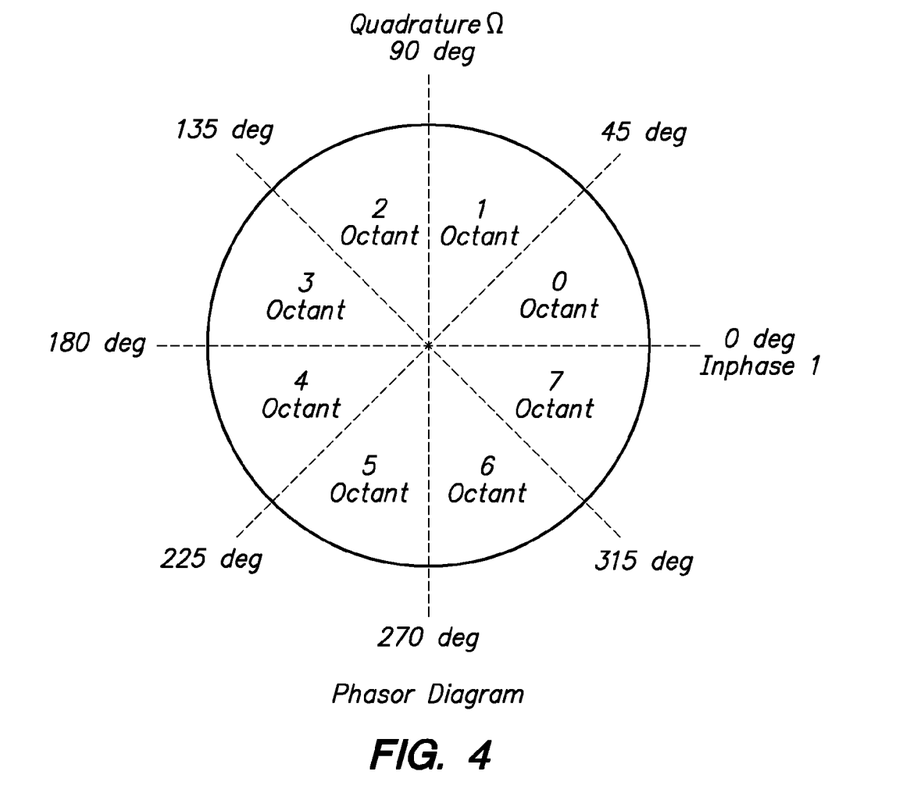
FIG. 4 shows a phasor diagram with phase numbers utilized with the present invention.

Stage 1: Phase Digitizer—The first stage in the NMF digitizes the phases and limits the received data. In FIG. 3, the I/Q serial or sequential input data samples 13 feeds a phase digitizer 12. Regardless of the number of bits in the input sample, a 3-bit phase is produced representing the phases {0°, 45°, 90°, 135°, 180°, 225°, 270°, 315°}. The 8 phases and their bit values are shown in Table 1. Phase 0 encompasses the input phase angles equal to 0° and less than 45°, phase 1 encompasses the input phase angles equal to 45° and less than 90°, and so on. The phase numbers are shown around the unit circle in FIG. 4. The dotted lines denote the decision regions for the phases. Upon conversion to phase, the magnitude is discarded, which makes this invention particularly powerful for low SNR signals. This limiting is also the reason why it is ideal for constant modulus signals. It should be clear from FIG. 4 that the decision regions are not a function of amplitude.

TABLE 1

Phase Representations

| Phase (°) | Phase Number | Binary |
|---|---|---|
| 0 | 0 | 000 |
| 45 | 1 | 001 |
| 90 | 2 | 010 |
| 135 | 3 | 011 |
| 180 | 4 | 100 |
| 225 | 5 | 101 |
| 270 | 6 | 110 |
| 315 | 7 | 111 |

Figure 5:
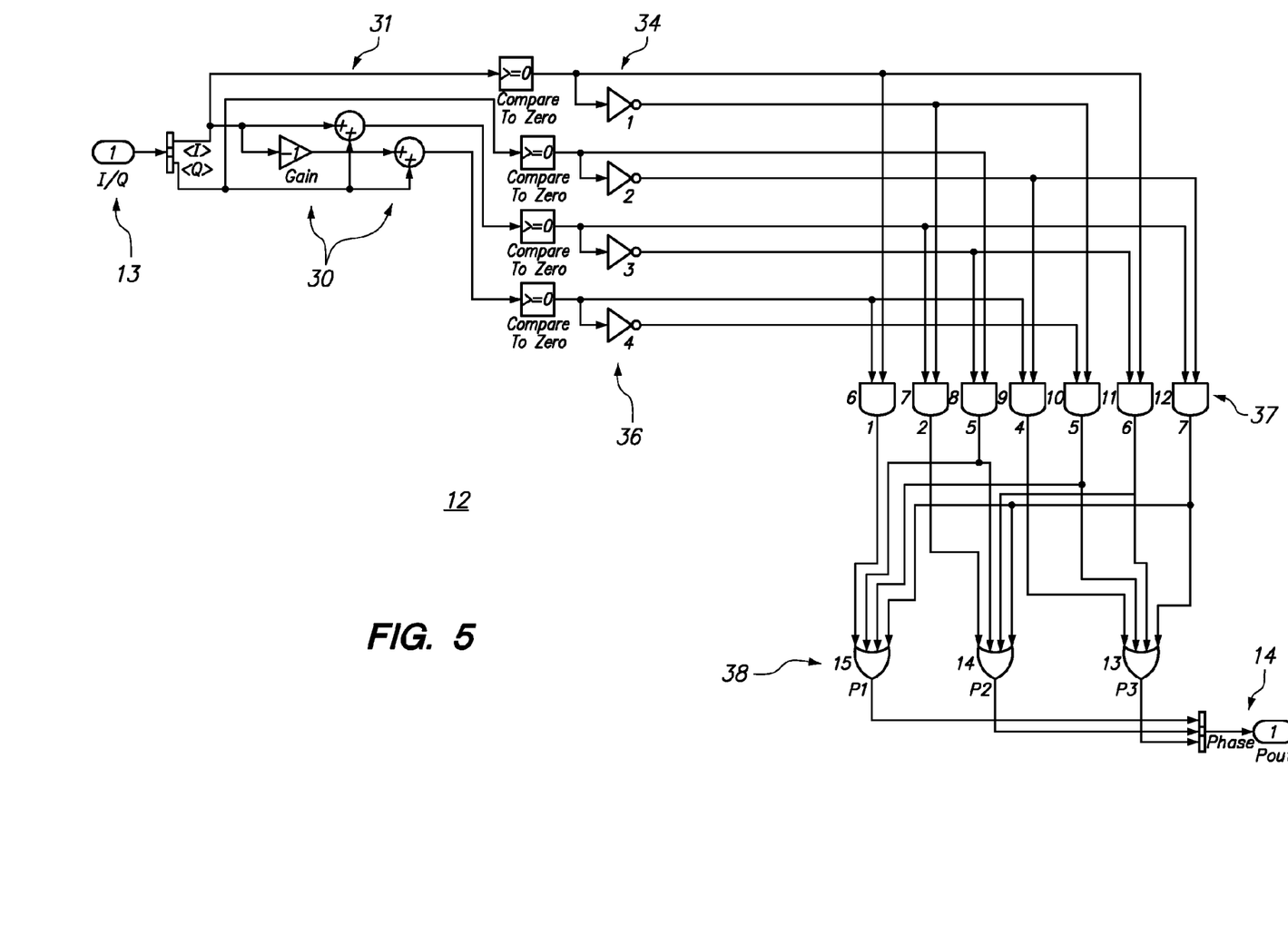
FIG. 5 shows a circuit diagram of a phase digitizer.

Referring to FIG. 5, the conversion from I/Q signal 13 to phase signal 14 in the phase digitizer 12 is accomplished with simple logic (one adder 31, one subtractor 30, four comparators 34, and a handful of simple logical operators-inverters 36, AND gates 37, and OR gates 38). The phase digitizer 12 shown in FIG. 5 can be implemented from the data shown in Table 1 and FIG. 4.

As examples, an I/Q sample is converted to phase 1 (45°) if I>0 AND Q−I>0; a sample is converted to phase 3 (135°) if Q>0 AND I+Q≦0. Again, note that the amplitude of the complex I/Q sample will not affect the phase value.

Stage 2: NMF Taps—The second stage is the NMF FIR taps. The present invention uses a modified systolic architecture to implement the NMF FIR taps. The component 16 shown in FIG. 3 is the heart of the processing. Instead of accumulating the output of a tap's complex product in two accumulators within each tap, the NMF increments/decrements one of the four accumulators in each tap by 1. The four accumulators are {0°, 45°, 90°, 135°} (or {0, 1, 2, 3}) and are equivalent to half the eight input phase values {0°, 45°, 90°, 135°, 180°, 225°, 270°, 315°} (or {0, 1, 2, ..., 7}). Note that subtracting 1 from one of the first four real accumulators (say, 90°) is equivalent to adding 1 to its mirror (270°) phase accumulator, and vice versa. Thus, the number of up/down counters necessary is half the number of digitized phases.

Conceptually, within any one tap, the accumulator or adder to be incremented or decremented is calculated by subtracting the tap coefficient phase from the 3-bit input phase. The mod-8 subtractor produces outputs that range from 0 to 7. These outputs are broken up into two parts: the two least significant bits (LSBs) are the accumulator address and the most significant bit (MSB) indicates whether to increment/decrement the accumulator. This phase subtraction is what is replacing the multiplies in a standard FIR filter.

The phase subtraction matrix in Table 2 shows which accumulators are incremented or decremented based on the subtraction of the 8 possible tap coefficients from the 8 possible input phases. The results can also be seen in FIG. 4 when the input phase is the starting position and the phases step counter-clockwise around the unit circle based on the number of the tap coefficient.

TABLE 2

Phase Subtraction Matrix

| Tap Coeff | Input | | | | | | | |
|---|---|---|---|---|---|---|---|---|
| | 0 | 1 | 2 | 3 | 4 | 5 | 6 | 7 |
| 0 | +[0] | +[1] | +[2] | +[3] | −[0] | −[1] | −[2] | −[3] |
| 1 | −[3] | +[0] | +[1] | +[2] | +[3] | −[0] | −[1] | −[2] |
| 2 | −[2] | −[3] | +[0] | +[1] | +[2] | +[3] | −[0] | −[1] |
| 3 | −[1] | −[2] | −[3] | +[0] | +[1] | +[2] | +[3] | −[0] |
| 4 | −[0] | −[1] | −[2] | −[3] | +[0] | +[1] | +[2] | +[3] |
| 5 | +[3] | −[0] | −[1] | −[2] | −[3] | +[0] | +[1] | +[2] |
| 6 | +[2] | +[3] | −[0] | −[1] | −[2] | −[3] | +[0] | +[1] |
| 7 | +[1] | +[2] | +[3] | −[0] | −[1] | −[2] | −[3] | +[0] |

In practice, the actual mod-8 subtraction is unnecessary. The phase subtraction is accomplished by wiring the counters in each tap for that specific tap coefficient. In other words, each of the 8 possible tap coefficients (phases 0 to 7) has the phase input wired to the counters uniquely. Mathematically, this corresponds to permutations and sign changes. In hardware, the phase subtractions are simple changes in wiring and inversions. The two LSBs of the phase are decoded to select one of four wires. Then, the MSB is used to determine whether the accumulator should increment or decrement depending on the coefficient value. The wiring of the 8 possible taps (i.e., for the 8 digitized phases) is shown in FIG. 6, FIG. 7, FIG. 8, and FIG. 9. Note that each tap 52 is actually made up only of four accumulators (i.e., up/down counters). The area inside the dotted box 52 is called the "NMF tap core".

In FIG. 6, FIG. 7, FIG. 8, and FIG. 9, the phase value 14 is input on the 2:4 decoder 50 on the top left of the tap core 52. For instance, in FIG. 6, for tap coefficient 0, the phase 14 is input to decoder 50-0. The output of the decoder 52-0 selects one of the accumulators/counters of tap core 52-0, and the MSB is used to indicate whether that accumulator/counter is to count up or down. Not shown in these figures is the input line to each accumulator/counter, which brings in the sum from the corresponding accumulator in the previous tap, or the output line, which passes the sum to the corresponding accumulator in the next tap. The clock line, which tell the up/down counters when to count, is also not shown.

Figure 6:
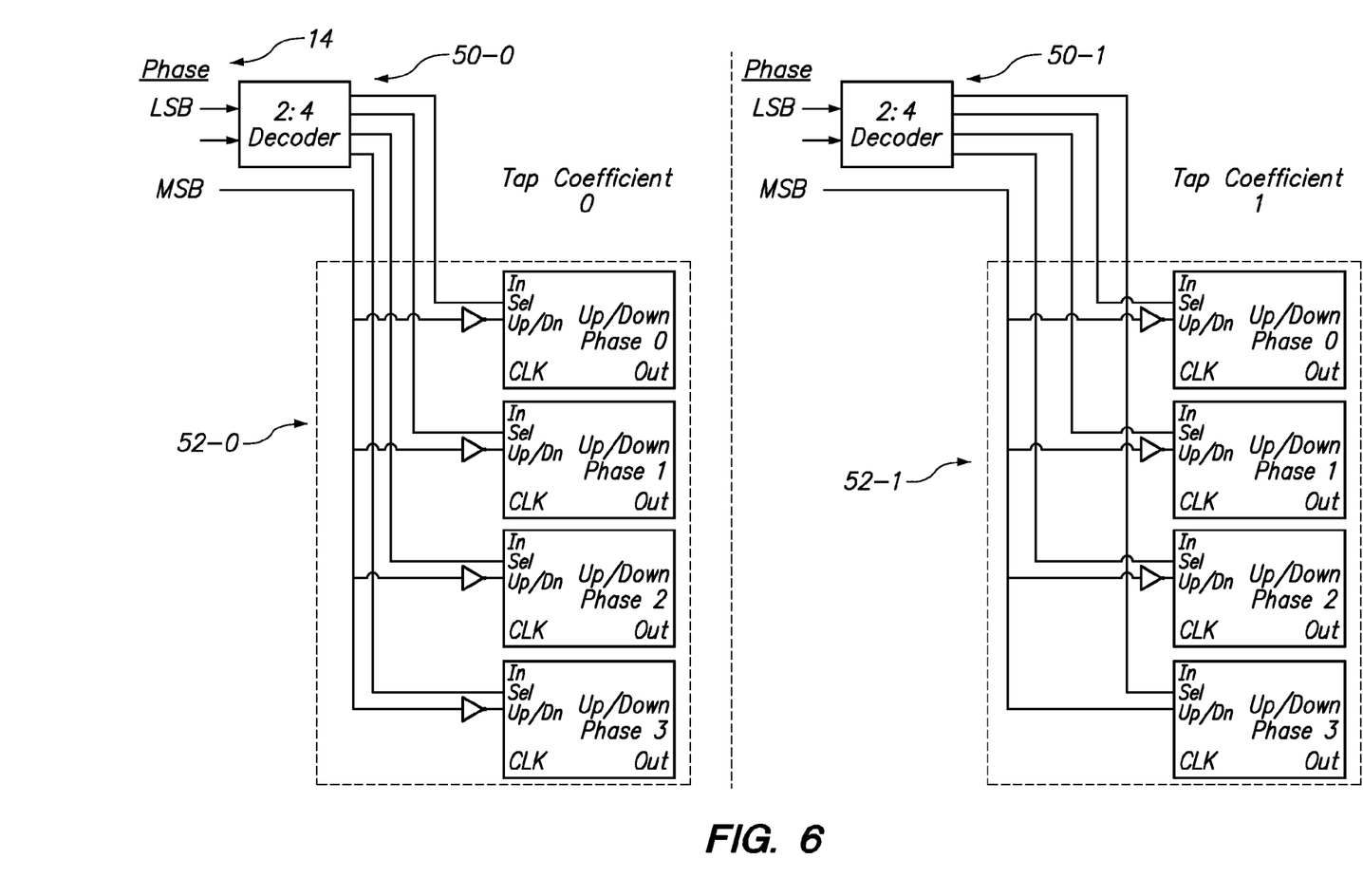
FIG. 6 shows wiring for NMF Tap Coefficients 0 and 1
Figure 7:
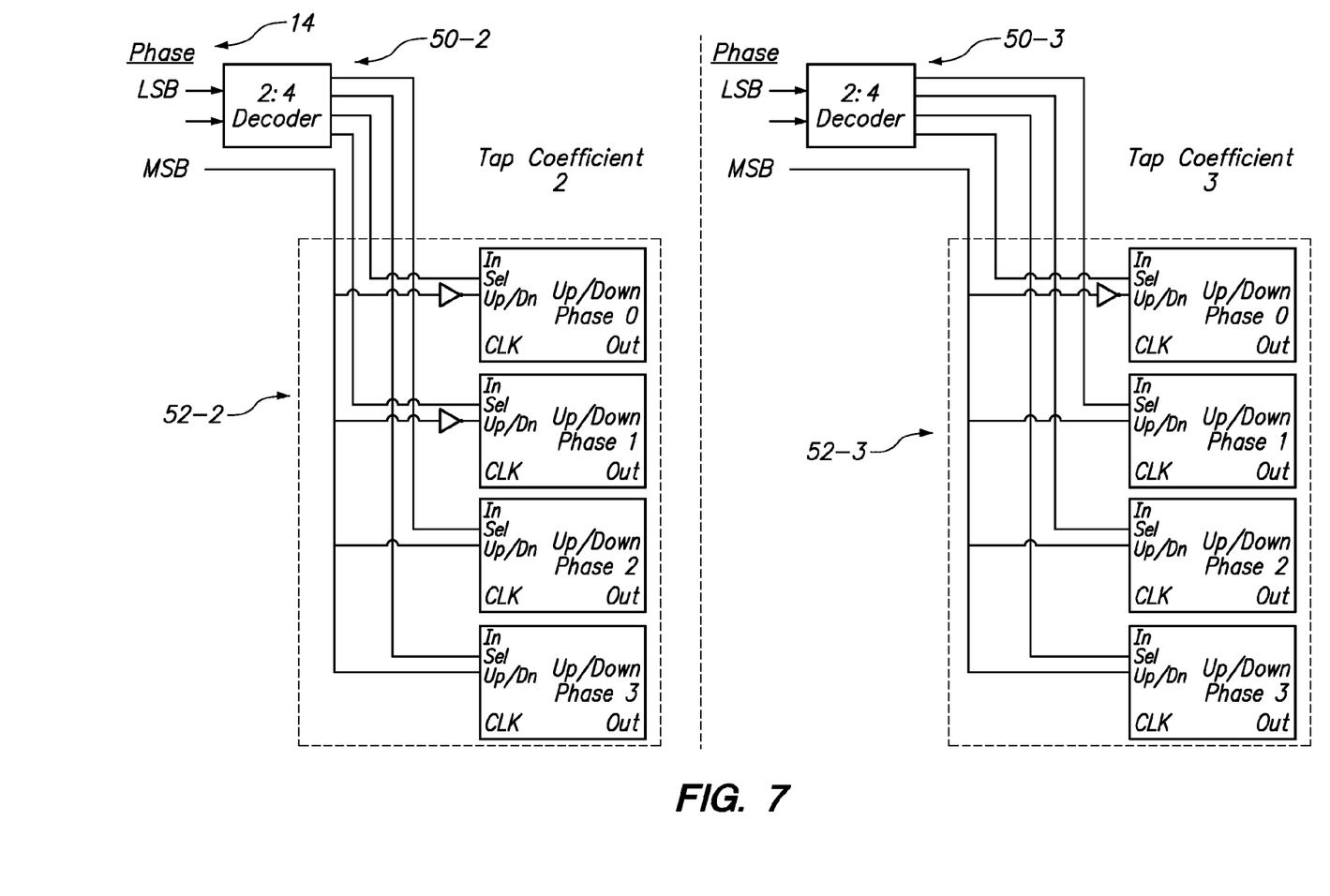
FIG. 7 shows wiring for NMF Tap Coefficients 2 and 3.
Figure 8:
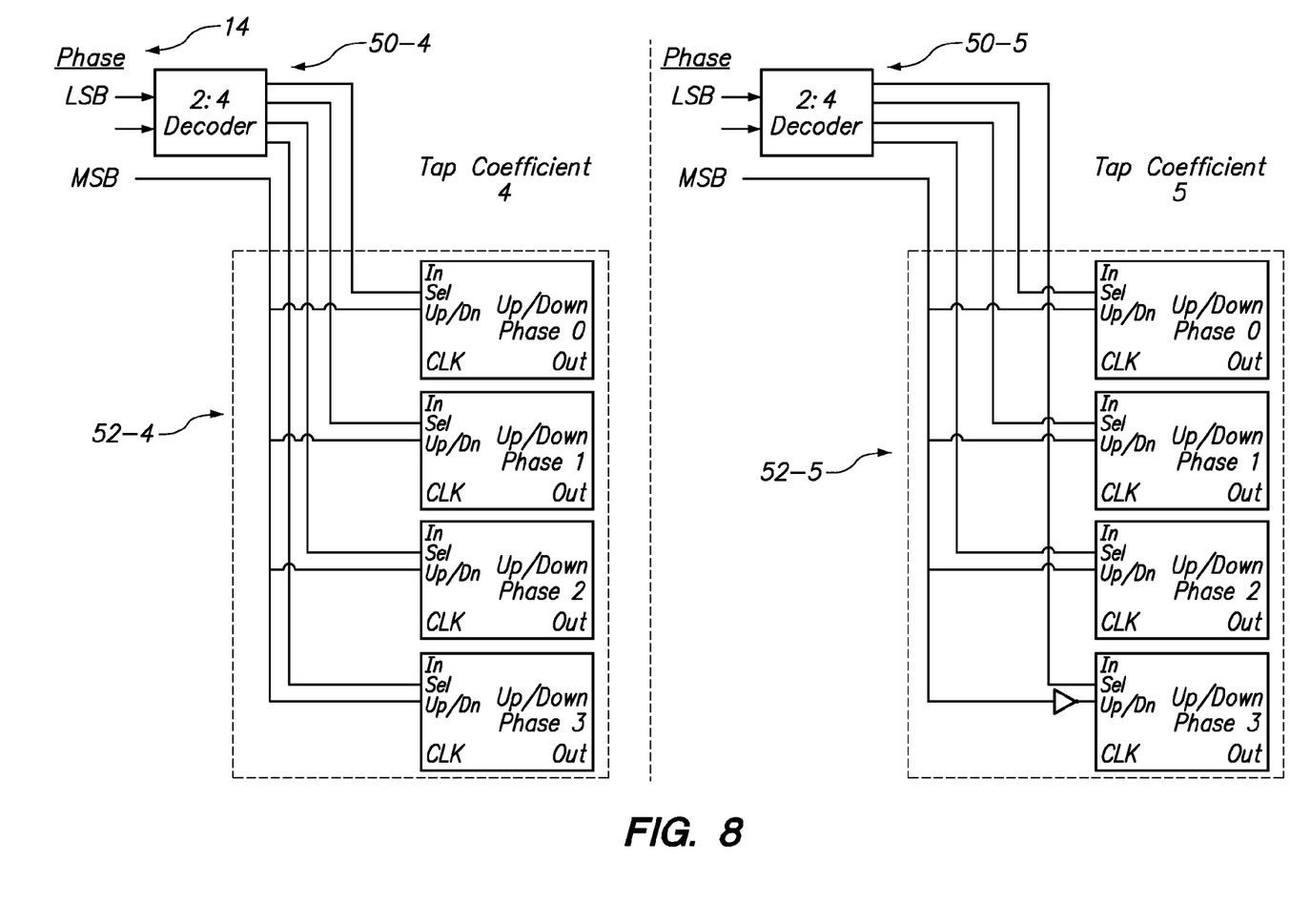
FIG. 8 shows wiring for NMF Tap Coefficients 4 and 5.
Figure 9:
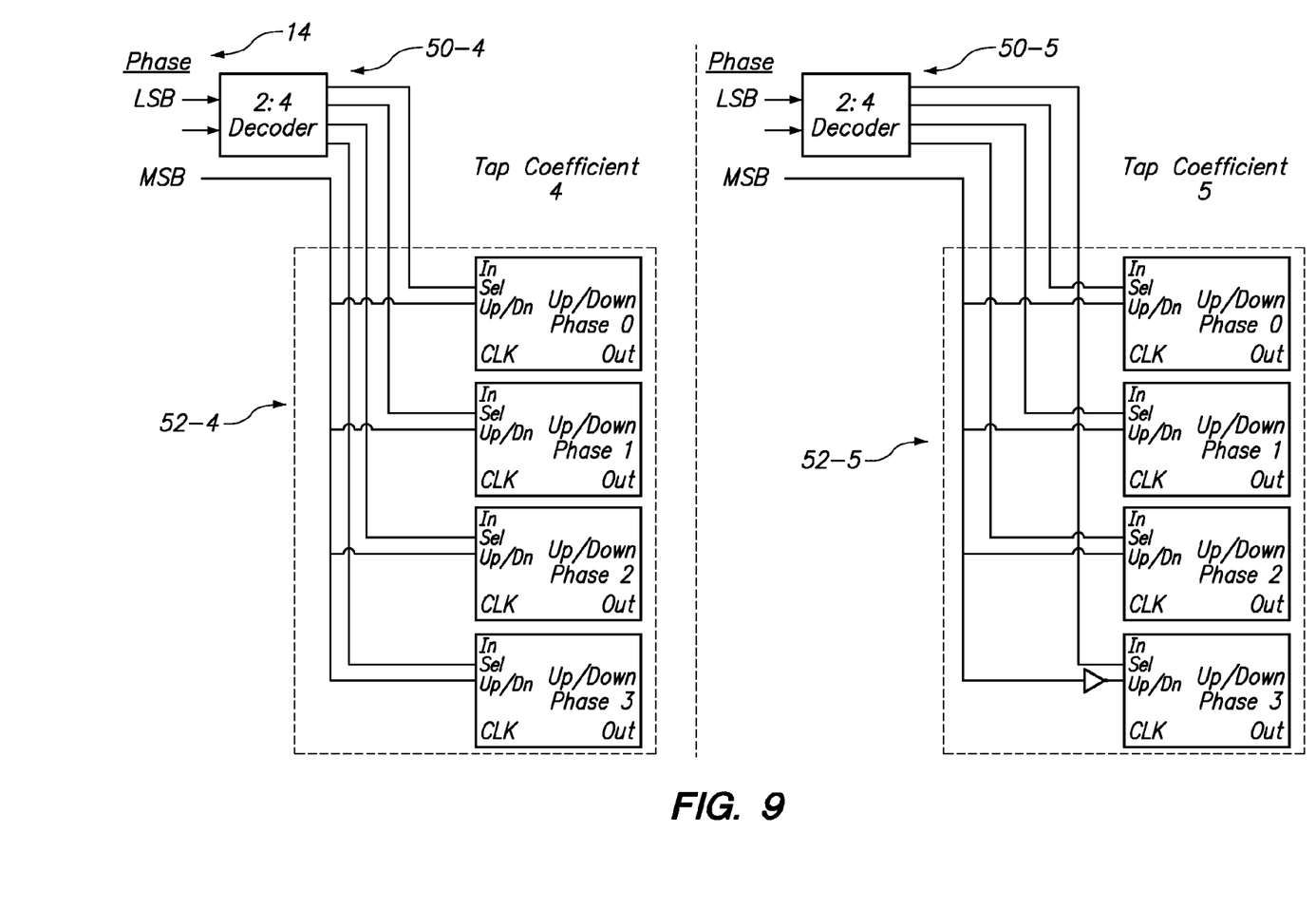
FIG. 9 shows wiring for NMF Tap Coefficients 6 and 7.

The remaining decoders 50 and accumulators/counters 52 shown in FIGS. 7-9 operate in a corresponding manner as with FIG. 6. Each accumulator/counter 50 is comprised of four up/down counters, for corresponding phases 0, 1, 2, 3, respectively, as shown.

Figure 10:
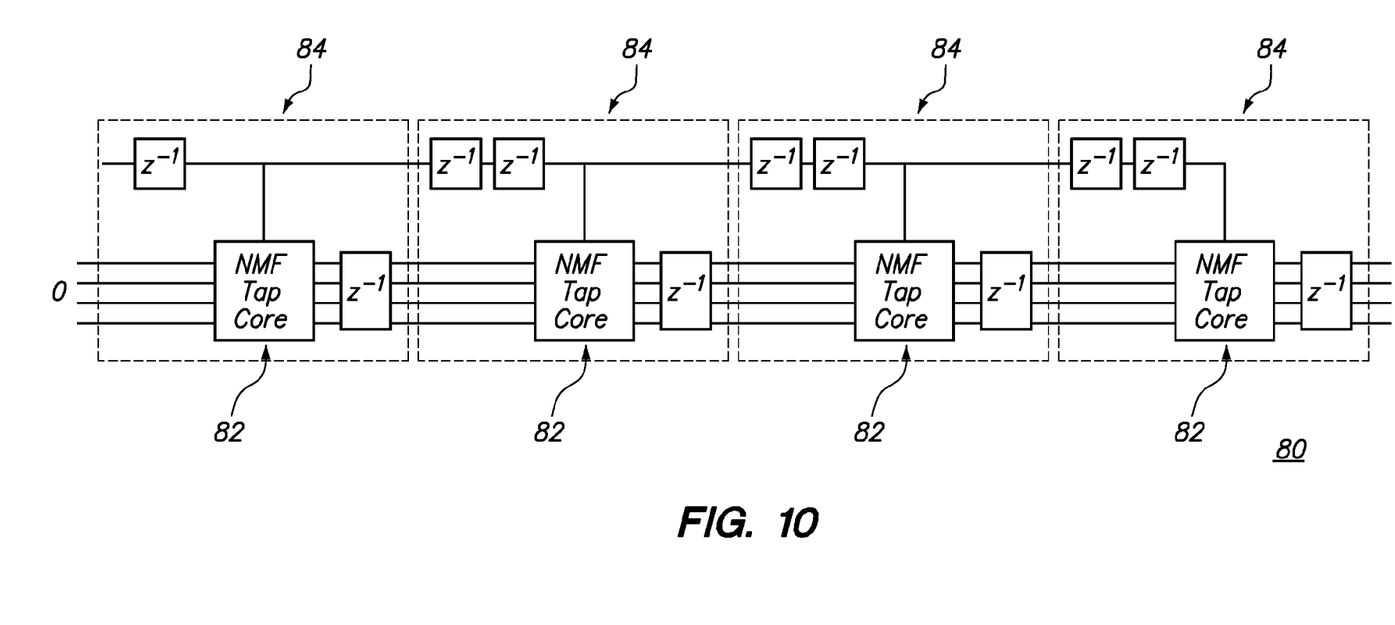
FIG. 10 shows a block diagram of a systolic FIR NMF.

FIG. 10 shows a systolic FIR NMF 80 block diagram for the present invention. The "NMF Tap Core" block 82 shown in FIG. 10 represents one of those shown in FIG. 6 through FIG. 9. Four wires are shown entering and leaving each tap to emphasize that there are four accumulators/counters whose results must be passed from one tap to the next. Each dashed box 84 in FIG. 10 is an "NMF Tap". The $z^{-1}$ unit delay operators shown in FIG. 10 operate in a similar manner as shown in FIG. 2.

Stage 3: I/Q Reconstruction—The last stage is reconstruction of the I/Q output 17 from the four phase accumulators. The output is constructed from the values of the four accumulators in the last tap ($p_0$, $p_1$, $p_2$, and $p_3$). The four phase accumulators represent the phases {0°, 45°, 90°, 135°}, and in I/Q $$p_0 = e^{j2\pi \cdot 0/8} = e^0 = 1$$

$$p_1 = e^{j2\pi \cdot 1/8} = e^{j\pi/4} = \frac{1}{\sqrt{2}} + j\frac{1}{\sqrt{2}}$$

$$p_2 = e^{j2\pi \cdot 2/8} = e^{j\pi/2} = j$$

$$p_3 = e^{j2\pi \cdot 3/8} = e^{j3\pi/4} = -\frac{1}{\sqrt{2}} + j\frac{1}{\sqrt{2}}$$

The phases are combined to produce the output z as follows:

$$z = p_0 + p_1 \cdot e^{j\pi/4} + p_2 \cdot e^{j\pi/2} + p_3 \cdot e^{j3\pi/4}$$
$$= \left(p_0 + \frac{1}{\sqrt{2}}p_1 - \frac{1}{\sqrt{2}}p_3\right) + j\left(p_2 + \frac{1}{\sqrt{2}}p_1 + \frac{1}{\sqrt{2}}p_3\right)$$

but as an approximation $$\sqrt{2} \approx 1.414 \approx 1.5 = \frac{3}{2}$$

so $$z \approx \left(p_0 + \frac{1}{3/2}p_1 - \frac{1}{3/2}p_3\right) + j\left(p_2 + \frac{1}{3/2}p_1 + \frac{1}{3/2}p_3\right)$$
$$\approx (3p_0 + 2[p_1 - p_3]) + j(3p_2 + 2[p_1 + p_3])$$

An output value is produced every time a new sample is shifted into the NMF. This output value closely approximates what would be obtained with a standard FIR filter using complex multiplications.

For a detection scenario, after the output is reconstructed into I/Q, the absolute value is computed and compared in a comparator to a predetermined threshold. A simple way to compute the absolute value is as follows: The definition of the absolute value of a complex number is $$\text{abs}(\alpha + j\beta) = \sqrt{\alpha^2 + \beta^2}$$

but it is desired to avoid the square and square root operations. Thus, the reported absolute value is the largest of 1) a 45° projection, $\rho$, 2) absolute value of the I component, $\alpha$, and 3) the absolute value of the Q component, $\beta$. The 45° projection is equivalent to adding the absolute values of $\alpha$ and $\beta$ together and dividing by $\sqrt{2}$. To avoid the multiplication by this irrational number, the approximation $1/\sqrt{2}=2/3$ is used again. Then the reported absolute value is the largest of {$2\rho$, $3 \cdot \text{abs}(\alpha)$, $3 \cdot \text{abs}(\beta)$}. This approximate magnitude value is next compared to a threshold.

The essence of the NMF is described mathematically as follows. The standard FIR filter equation may be written as:

$$y_k = \sum_{n=0}^{N-1} h_n r_{k-n}$$

where h are the filter coefficients and r is the data to be filtered. This equation may also be written in polar form as:

$$y_k = \sum_{n=0}^{N-1} A_n \exp\left(\frac{j2\pi\Theta_n}{8}\right) B_{k-n} \exp\left(\frac{j2\pi\Phi_{k-n}}{8}\right)$$

where $A_n$ is the magnitude of $h_n$, $\Theta_n$ is the octant phase value of $h_n$ (0, 1, . . . , 7), $B_{k-n}$ is the magnitude of $r_{k-n}$, and $\Phi_{k-n}$ is the octant phase value of $r_{k-n}$. Discarding the magnitudes of both the filter and received data (under a constant modulus assumption), we have:

$$y_k = \sum_{n=0}^{N-1} \exp\left(\frac{j2\pi\Theta_n}{8}\right)\exp\left(\frac{j2\pi\Phi_{k-n}}{8}\right) = \sum_{n=0}^{N-1} \exp\left(\frac{j2\pi[(\Theta_n + \Phi_{k-n}) \bmod 8]}{8}\right)$$

and we shall denote:

$$\delta_{k-n} = [(\Theta_n + \Phi_{k-n}) \bmod 8] \subset \{0,1,2,3,4,5,6,7\}$$

Thus, the output of the NMF is given by:

$$y_k = \sum_{n=0}^{N-1} \left\{\exp\left(j \cdot \frac{2\pi}{8}\delta_{k-n}\right)\right\}$$

which can be rewritten as:

$$y_k = \sum_{n=0}^{N-1} \left\{\exp\left(j \cdot \frac{2\pi}{8}\delta_{k-n}\right)\right\} = \sum_{m=0}^{7}\sum_{n=0}^{N-1} \exp\left(j \cdot \frac{2\pi}{8}m\right)(\delta_{k-n} = m)$$

Here, the expression ($\delta_{n+k}=m$) is the Kronecker delta function:

$$(\delta_{k-n}=m)=1$$
$$(\delta_{k-n}\neq m)=0$$

This notation is used to minimize the confusion between the phase difference, $\delta_{k-n}$, and the conventional Kronecker delta function symbol, $\delta_{n,k}$. The effect of the delta function is to pick only the terms in the sum (from 0 to N-1) that are equal to m. Noting that the phasor, $$\exp\left(j \cdot \frac{2\pi}{8}m\right),$$

is not a function of n we can commute it across the inner summation:

$$y_k = \sum_{m=0}^{7} \exp\left(j \cdot \frac{2\pi}{8}m\right)\sum_{n=0}^{N-1}(\delta_{k-n} = m)$$

Such an implementation requires 8 accumulators (counters) for each of the phases.

The number of accumulators can be reduced by half by taking advantage of the fact that first four phases are the negative of the last four phases. Thus, we split the above equation into two summations:

$$y_k = \sum_{m=0}^{3} \exp\left(j \cdot \frac{2\pi}{8} m\right) \sum_{n=0}^{N-1} (\delta_{k-n} = m) + \sum_{m=4}^{7} \exp\left(j \cdot \frac{2\pi}{8} m\right) \sum_{n=0}^{N-1} (\delta_{k-n} = m)$$

Redefining m in the right sum gives:

$$y_k = \sum_{m=0}^{3} \exp\left(j \cdot \frac{2\pi}{8} m\right) \sum_{n=0}^{N-1} (\delta_{k-n} = m) + \sum_{m=0}^{3} \exp\left[j \cdot \frac{2\pi}{8} m + 4\right] \sum_{n=0}^{N-1} [\delta_{k-n} = (m+4)]$$

Taking advantage of the fact that:

$$\exp\left[j \cdot \frac{2\pi}{8}(m+4)\right] = \exp\left(j \cdot \frac{2\pi}{8} 4\right) \exp\left(j \cdot \frac{2\pi}{8} m\right) = -\exp\left(j \cdot \frac{2\pi}{8} m\right)$$

gives the result:

$$y_k = \sum_{m=0}^{3} \exp\left(j \cdot \frac{2\pi}{8} m\right) \sum_{n=0}^{N-1} (\delta_{k-n} = m) + \sum_{m=0}^{3} \exp\left(j \cdot \frac{2\pi}{8} m\right) \left\{ -\sum_{n=0}^{N-1} [\delta_{k-n} = (m+4)] \right\}$$

Combining terms provides:

$$y_k = \sum_{m=0}^{3} \exp\left(j \cdot \frac{2\pi}{8} m\right) \left\{ \sum_{n=0}^{N-1} (\delta_{k-n} = m) - [\delta_{k-n} = (m+4)] \right\}$$

The above equation can be written as the following inner product:

$$y_k = \begin{bmatrix} 1 & e^{j\pi/4} & j & je^{j\pi/4} \end{bmatrix} \begin{bmatrix} \sum_{n=0}^{N-1} (\delta_{k-n} = 0) - (\delta_{k-n} = 4) \\ \sum_{n=0}^{N-1} (\delta_{k-n} = 1) - (\delta_{k-n} = 5) \\ \sum_{n=0}^{N-1} (\delta_{k-n} = 2) - (\delta_{k-n} = 6) \\ \sum_{n=0}^{N-1} (\delta_{k-n} = 3) - (\delta_{k-n} = 7) \end{bmatrix}$$

What the last equation reveals is that a FIR filter may be implemented using phase additions (or subtractions in the case of a matched filter) to increment/decrement accumulators representing half the phases of interest. In this case, we need four accumulators for the 8 phases. These sums can then be converted from phase accumulations to a complex output with multiplications by the proper complex exponentials. It was shown above that these multiplications can be approximated with additions and/or shifts (for multiplications by powers of 2).

One advantage of this invention is that it eliminates the complex multiplies typically found in FIR filters. It instead uses phase additions (implemented with wiring changes). The benefit of this is two-fold: 1) it reduces the width of the registers needed to store the output from each tap (because the output size doubles in bits for a multiplication, but in an NMF tap, the result grows by at most 1-bit) and 2) additions are much less resource-intensive to perform than multiplications.

Another advantage is that converting a complex number to phase only (i.e., discarding the magnitude) results in significant interference rejection. That is, short pulses (with respect to the length of the filter) could cause large peaks at the output of a standard FIR filter with multiplies, but would not do so in the NMF. Further, the processing loss of the NMF is minimal for low SNR signals. In fact, the NMF has less loss for lower SNR signals than for higher SNR signals.

An additional advantage is that the bit widths in the NMF architecture are static. Despite the bit width of the input I/Q samples, the phase is represented by a fixed number of bits (i.e., $\log_2$(number of phases)) so the bit growth is predictable. In a standard FIR filter, the bit growth depends on the size in bits of the input I/Q samples, which means a redesign if the size of the I/Q samples changes.

The feature that is believed to be new is the replacement of complex multiplications with phase additions (implemented with wiring changes and up/down counters) in a FIR filter.

While the 8-phase scheme was described above, this invention is applicable to any number of phases. Increasing the number of phases will decrease the processing loss, but will increase the hardware resources needed.

Up counters for each phase can be used instead of the up/down counters for half the phases.

An erasure mechanism may be included to ignore loud pulses. That is, if the magnitude of an incoming I/Q sample is greater than a threshold value, an erasure bit is used to exclude this sample from processing. When an NMF tap sees this erasure bit it does not perform any accumulation and instead just passes the value it received from the previous tap. This has the function of not adding noise from this sample to the result.

The 2:4 decoders shown in FIG. 6 through FIG. 9 can either be contained within each tap or included as part of the phase digitizer block.

The NMF may be restructured in a polyphase, or similar, implementation.

A bank of NMFs can be used to perform an ambiguity function for search in both time and frequency by frequency shifting the tap coefficient phases.

The NMF architecture may be implemented for any type of filter application, not necessarily a matched filter.

A scheme could be implemented where the magnitude of the input I/Q sample is not thrown away, but passed along with the phase. This could then be used to increment/decrement the selected accumulator more than ±1.

The $\sqrt{(2)} \approx 3/2$ approximation is one possible approximation for the I/Q reconstruction. Another is $\sqrt{(2)} \approx 17/12$, which is slightly more difficult to implement, but is a better approximation. Others are possible as well.

The NMF taps may be implemented in different ways. The accumulator may be replaced by up/down counters with separate up and down inputs. In this case, up and down wires are used to feed each input, which may be reversed depending on the tap coefficient. The NMF may be implemented for other filter architectures, such as a transposed architecture.

From the above description, it is apparent that various techniques may be used for implementing the concepts of the present invention without departing from its scope. As described above, the purpose of the no-multiply filter (NMF) is to reduce the size of a FIR filter when implemented in hardware (and thus its weight and its power consumption) by replacing multiplications of complex numbers with additions of phases. The described embodiments are to be considered in all respects as illustrative and not restrictive. It should also be understood that the system is not limited to the particular embodiments described herein, but is capable of many embodiments without departing from the scope of the claims.

What is claimed is:

1. A finite impulse response (FIR) filter comprising
a phase digitizer for converting input I/Q sequential data samples into digitized phase signals, the digitized phase signals having a fixed number of bit values representative of the number of digitized phases;
no-multiply filter (NMF) taps for receiving the digitized phase signals, the taps including incrementable or decrementable phase accumulators for implementing NMF finite impulse response taps where at each tap only the respective phases are accumulated and where a tap coefficient phase corresponds to the digitized phases of the complex filter coefficient, and
an I/Q reconstruction stage for reconstructing an I/Q output from the values of the phase accumulators in the last tap where the phase values are combined to produce the I/Q output.

2. The filter of claim 1 where the phase subtraction is accomplished by uniquely wiring the accumulators in each tap for a respective tap coefficient.

3. The filter of claim 2 where a tap coefficient phase corresponds to the digitized phases, and where an accumulator to be incremented or decremented is calculated by subtracting the tap coefficient phase from the digitized phase signal input.

4. The filter of claim 3 where the accumulators are counters.

5. The filter of claim 3 where the accumulators are up/down counters.

6. The filter of claim 5 where the phase digitizer quantizes the I/Q data samples.

7. The filter of claim 6 where the phase digitizer limits the amplitude of the received I/Q data samples during conversion and discards the limited amplitude after conversion.

8. The filter of claim 7 where the last coefficients p0, p1, p2, p3 are in the form $$p_0 = e^{j2\pi \cdot 0/8} = e^0 = 1$$

$$p_1 = e^{j2\pi \cdot 1/8} = e^{j\pi/4} = \frac{1}{\sqrt{2}} + j\frac{1}{\sqrt{2}}$$

$$p_2 = e^{j2\pi \cdot 2/8} = e^{j\pi/2} = j$$

$$p_3 = e^{j2\pi \cdot 3/8} = e^{j3\pi/4} = -\frac{1}{\sqrt{2}} + j\frac{1}{\sqrt{2}}$$

and the output value z has the form $$z \approx \left(p_0 + \frac{1}{3/2}p_1 - \frac{1}{3/2}p_3\right) + j\left(p_2 + \frac{1}{3/2}p_1 + \frac{1}{3/2}p_3\right)$$
$$\approx (3p_0 + 2[p_1 - p_3]) + j(3p_2 + 2[p_1 + p_3]).$$

9. The filter of claim 8 including a decoder for decoding the phase signals.

10. The filter of claim 9 including an erasure bit for excluding an I/Q sample if the magnitude of the I/Q sample is greater than a predetermined threshold.

11. The filter of claim 10 including a comparator for comparing the absolute value of the I/Q output with a predetermined threshold.

12. A no-multiply finite impulse response (FIR) filter comprising
a phase digitizer for converting input I/Q sequential data samples into digitized phase signals, the digitized phase signals having a fixed number of bit values representative of the number of digitized phases;
no-multiply filter (NMF) taps for receiving the digitized phase signals, the taps including uniquely wired phase accumulators for implementing NMF finite impulse response taps where at each uniquely wired tap only the respective phases are accumulated and where a tap coefficient phase corresponds to the digitized phases of the complex filter coefficient, and where an accumulator to be incremented or decremented is calculated by subtracting the tap coefficient phase from the digitized phase signal input; and
an I/Q reconstruction stage for reconstructing an I/Q output from the values of the phase accumulators in the last tap where the phase values are combined to produce the I/Q output.

13. A systolic finite impulse response no-multiply filter (NMF) comprising
a systolic architecture of NMF taps, each NMF tap including
a phase digitizer for converting input I/Q sequential data samples into digitized phase signals, the digitized phase signals having a fixed number of bit values representative of the number of digitized phases;
no-multiply filter (NMF) taps for receiving the digitized phase signals, the taps including incrementable or decrementable phase accumulators for implementing NMF finite impulse response taps where at each tap only the respective phases are accumulated and where a tap coefficient phase corresponds to the digitized phases of the complex filter coefficient, and where an accumulator to be incremented or decremented is calculated by subtracting the tap coefficient phase from the digitized phase signal input; and
an I/Q reconstruction stage for reconstructing an I/Q output from the values of the phase accumulators in the last tap where the phase values are combined to produce the I/Q output.

* * * * *